US009355878B2

(12) United States Patent
Abarra et al.

(10) Patent No.: US 9,355,878 B2
(45) Date of Patent: May 31, 2016

(54) SUBSTRATE PROCESSING APPARATUS

(71) Applicant: iZA Corporation, Fuchu-shi, Tokyo (JP)

(72) Inventors: Einstein Noel Abarra, Hachioji (JP); Yukihito Tashiro, Chofu (JP)

(73) Assignee: TDK Corporation, Tokyo (JP)

( * ) Notice: Subject to any disclaimer, the term of this patent is extended or adjusted under 35 U.S.C. 154(b) by 146 days.

(21) Appl. No.: 14/051,452

(22) Filed: Oct. 11, 2013

(65) Prior Publication Data

US 2014/0105709 A1   Apr. 17, 2014

(30) Foreign Application Priority Data

Oct. 12, 2012   (JP) .................................. 2012-226988

(51) Int. Cl.
*H01L 21/677* (2006.01)
*H01L 21/67* (2006.01)
*H01L 21/687* (2006.01)

(52) U.S. Cl.
CPC ...... *H01L 21/67739* (2013.01); *H01L 21/6719* (2013.01); *H01L 21/67178* (2013.01); *H01L 21/68785* (2013.01)

(58) Field of Classification Search
CPC ............... H01L 21/67178; H01L 21/67739; H01L 21/68785; H01L 21/6719
USPC ......................................... 414/217, 221, 939
See application file for complete search history.

(56) References Cited

U.S. PATENT DOCUMENTS

| | | | | |
|---|---|---|---|---|
| 6,079,928 | A | * | 6/2000 | Theriault et al. ............... 414/217 |
| 6,183,564 | B1 | * | 2/2001 | Reynolds et al. ............. 118/719 |
| 6,186,722 | B1 | | 2/2001 | Shirai |
| 6,338,626 | B1 | * | 1/2002 | Saeki ............................. 432/243 |
| 6,352,623 | B1 | * | 3/2002 | Volodarsky et al. ........ 204/275.1 |

(Continued)

FOREIGN PATENT DOCUMENTS

| | | |
|---|---|---|
| JP | H02-196441 | 8/1990 |
| JP | H09-246347 | 9/1997 |

(Continued)

OTHER PUBLICATIONS

English language translation of the following: Office action dated Jul. 14, 2015 from the JPO in a Japanese patent application corresponding to the instant patent application.

(Continued)

*Primary Examiner* — Dean Kramer
(74) *Attorney, Agent, or Firm* — SOLARIS Intellectual Property Group, PLLC

(57) ABSTRACT

Disclosed is a substrate processing apparatus including first and second chambers stacked one above the other; a first opening that is provided in a wall of the first chamber that faces the second chamber, and that allows a substrate to pass through the first opening; a second opening that is provided in a wall of the second chamber that is in communication with the first opening and that allows the substrate to pass through the second opening; an opening and closing member that is provided inside the first chamber so as to move up and down and that opens and closes the first opening; a substrate mounting member that is provided closer to the second chamber than the opening and closing member, and that moves the substrate between the first and second chambers; and a substrate processing member provided in the second chamber.

6 Claims, 14 Drawing Sheets

(56) References Cited

U.S. PATENT DOCUMENTS

| | | | |
|---|---|---|---|
| 6,395,094 B1 * | 5/2002 | Tanaka et al. | 118/719 |
| 6,409,837 B1 * | 6/2002 | Hillman | 118/712 |
| 6,455,098 B2 * | 9/2002 | Tran et al. | 427/8 |
| 6,729,824 B2 * | 5/2004 | Lei et al. | 414/217 |
| 2002/0017377 A1 | 2/2002 | Koguchi et al. | |
| 2005/0006230 A1 | 1/2005 | Narushima | |
| 2005/0269030 A1 * | 12/2005 | Kent et al. | 156/345.31 |
| 2007/0089852 A1 | 4/2007 | Koguchi et al. | |

FOREIGN PATENT DOCUMENTS

| | | |
|---|---|---|
| JP | H10-242234 | 9/1998 |
| JP | 2000-119848 A | 4/2000 |
| JP | 2000-299367 | 10/2000 |
| JP | 2002-058985 A | 2/2002 |
| JP | 2003-077976 A | 3/2003 |
| JP | 2008-502135 A | 1/2008 |
| JP | 2008-153339 A | 7/2008 |
| JP | 2011-138859 A | 7/2011 |
| WO | 2007/013424 A1 | 2/2007 |

OTHER PUBLICATIONS

English language translation of the following: Office action dated Mar. 29, 2016 from the JPO in a Japanese patent application corresponding to the instant patent application.

* cited by examiner

SUBSTRATE PROCESSING APPARATUS

CROSS-REFERENCE TO RELATED APPLICATION

This application claims priority under 35 USC 119 from Japanese Patent Application No. 2012-226988 filed on Oct. 12, 2012, the disclosure of which is incorporated by reference herein.

BACKGROUND

The present invention relates to a substrate processing apparatus and a module for a substrate processing apparatus, and in particular to a substrate processing apparatus for manufacturing a semiconductor device and a magnetic device.

There is increasing demand to increase device functionality and to raise manufacturing yield in a number of processing processes for manufacturing semiconductor devices and magnetic devices. Consequently, the number of necessary substrate processing chambers is increasing. As a result there has also been an increase in the floor space needed for substrate processing apparatuses.

A substrate processing apparatus that occupies a small floor space is accordingly desired.

SUMMARY

A principle object of the present invention is to provide a substrate processing apparatus that occupies a small floor space.

According to an aspect of the present invention, there is provided a substrate processing apparatus including:

a first chamber and a second chamber that are provided stacked one above the other;

a first opening that is provided in a first wall of the first chamber that faces the second chamber, and that allows a substrate to pass through the first opening;

a second opening that is provided in a wall of the second chamber that faces the first chamber, that is in communication with the first opening, and that allows the substrate to pass through the second opening;

an opening and closing member that is provided inside the first chamber so as to move up and down and that opens and closes the first opening;

a substrate mounting member that is provided closer to the second chamber than the opening and closing member, that mounts the substrate and that moves the substrate between within the first chamber and within the second chamber; and a substrate processing member that is provided in the second chamber and that processes the substrate.

According to another aspect of the present invention, there is provided a module for a substrate processing apparatus including:

a first chamber and a second chamber that are provided stacked one above the other;

a first opening that is provided in a first wall of the first chamber that faces the second chamber, and that allows a substrate to pass through the first opening;

a second opening that is provided in a wall of the second chamber that faces the first chamber, that is in communication with the first opening, and that allows the substrate to pass through the second opening;

an opening and closing member that is provided inside the first chamber so as to move up and down and that opens and closes the first opening;

a substrate mounting member that is provided closer to the second chamber than the opening and closing member, that mounts the substrate and that moves the substrate between within the first chamber and within the second chamber; and a substrate processing member that is provided in the second chamber and that processes the substrate.

BRIEF DESCRIPTION OF THE DRAWINGS

Exemplary embodiments of the present invention will be described in detail based on the following figures, wherein.

DETAILED DESCRIPTION

Explanation follows regarding preferable exemplary embodiments of the present invention, with reference to the drawings.

First Exemplary Embodiment

Figure 1:
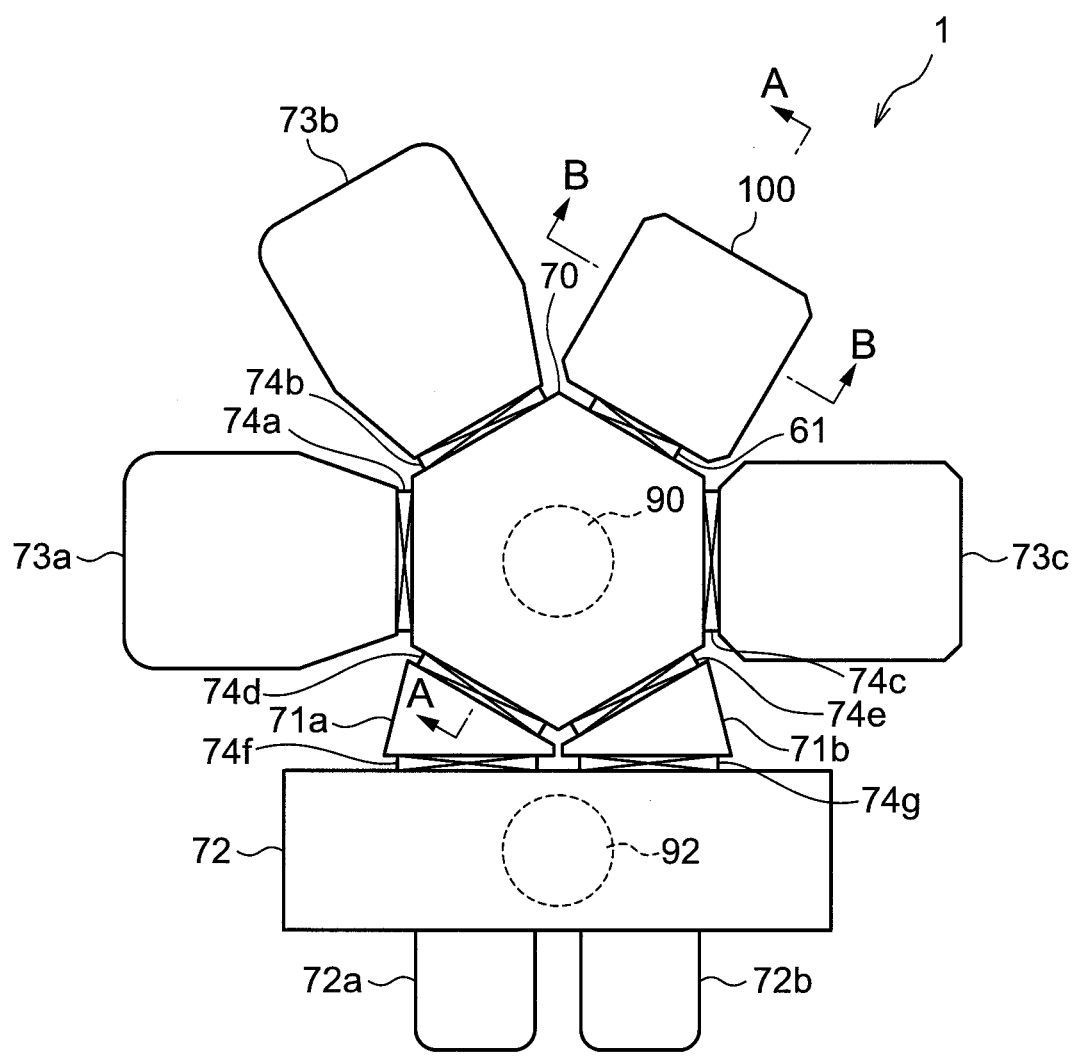
FIG. 1 is a schematic plan view to explain a substrate processing apparatus of a preferable first exemplary embodiment of the present invention.

Referring to FIG. 1, a typical cluster shape of an apparatus for vacuum processing a substrate is illustrated as a substrate processing apparatus 1 of a preferable first exemplary embodiment of the present invention. Preferable examples applied as a substrate 22 are for example a silicon wafer or an AlTiC ($Al_2O_3$—TiC) wafer.

The substrate processing apparatus 1 includes a transfer core chamber 70, a chamber assembly 100 attached to a side wall of the transfer core chamber 70, process chambers 73a, 73b, 73c, a load lock chamber 71a and a unload lock chamber 71b, a front end module 72 that is attached to a load lock chamber 71a and an unload lock chamber 71b, and Front Opening Universal Pod (FOUP) units 72a, 72b for inserting substrates into or removing substrates from the substrate processing apparatus 1.

Gate valves 61, 74a, 74b, 74c and slit valves 74d, 74e are respectively attached between the transfer core chamber 70, and the chamber assembly 100, the process chambers 73a, 73b, 73c, the load lock chamber 71a and the unload lock chamber 71b. Gate valve 74f and 74g are respectively attached between the front end module 72, and the load lock chamber 71a and the unload lock chamber 71b.

The transfer core chamber 70 is provided with a substrate transfer robot 90 capable of transferring substrates between the chamber assembly 100, the process chambers 73a, 73b, 73c, the load lock chamber 71a and the unload lock chamber 71b, the load lock chamber 71a and the unload lock chamber 71b. The front end module 72 is provided with a substrate transfer robot 92 capable of transferring substrates between the load lock chamber 71a, the unload lock chamber 71b and the FOUP units 72a, 72b.

Figure 2:
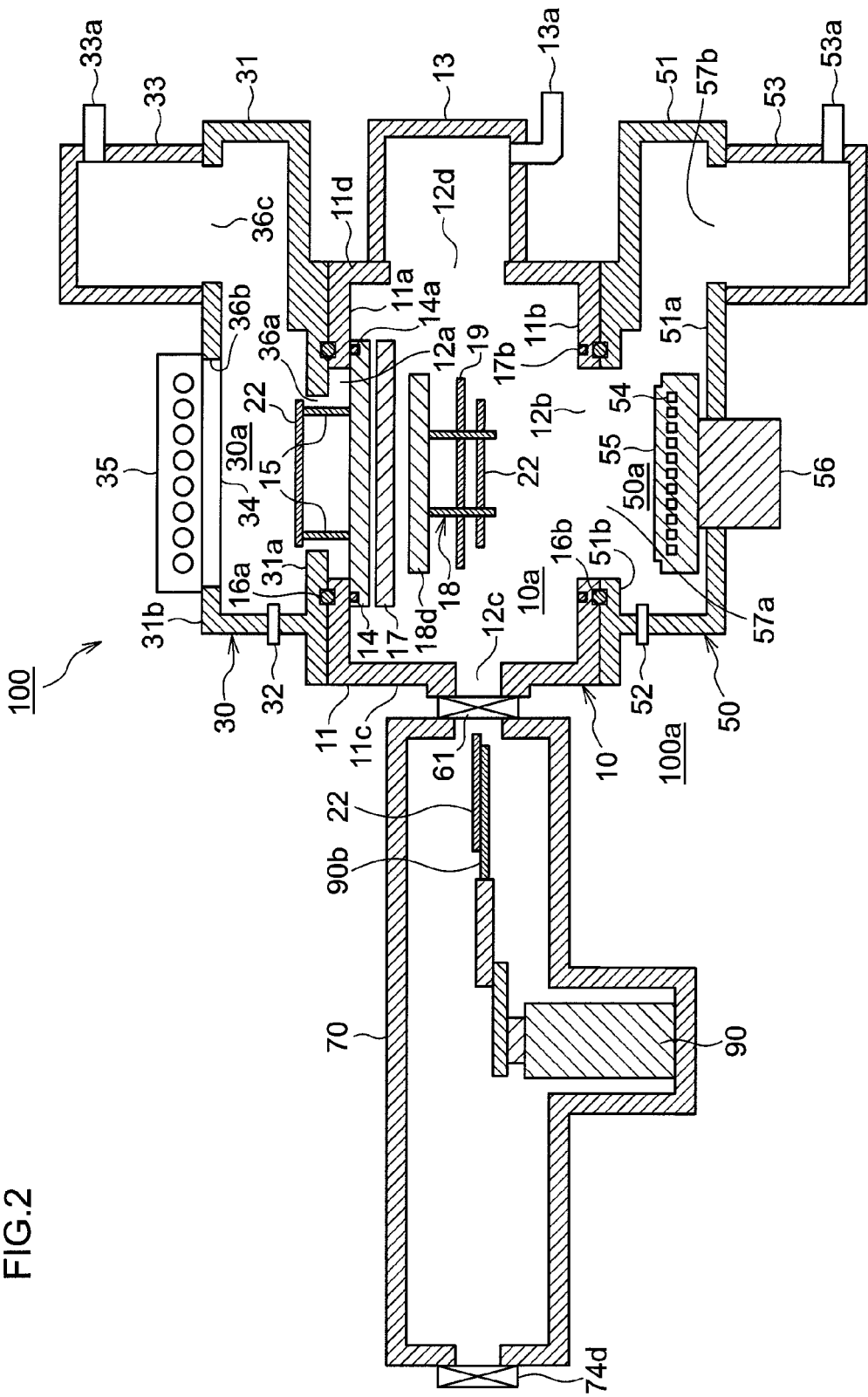
FIG. 2 is a schematic vertical cross-section taken on line A-A of FIG. 1.
Figure 3:
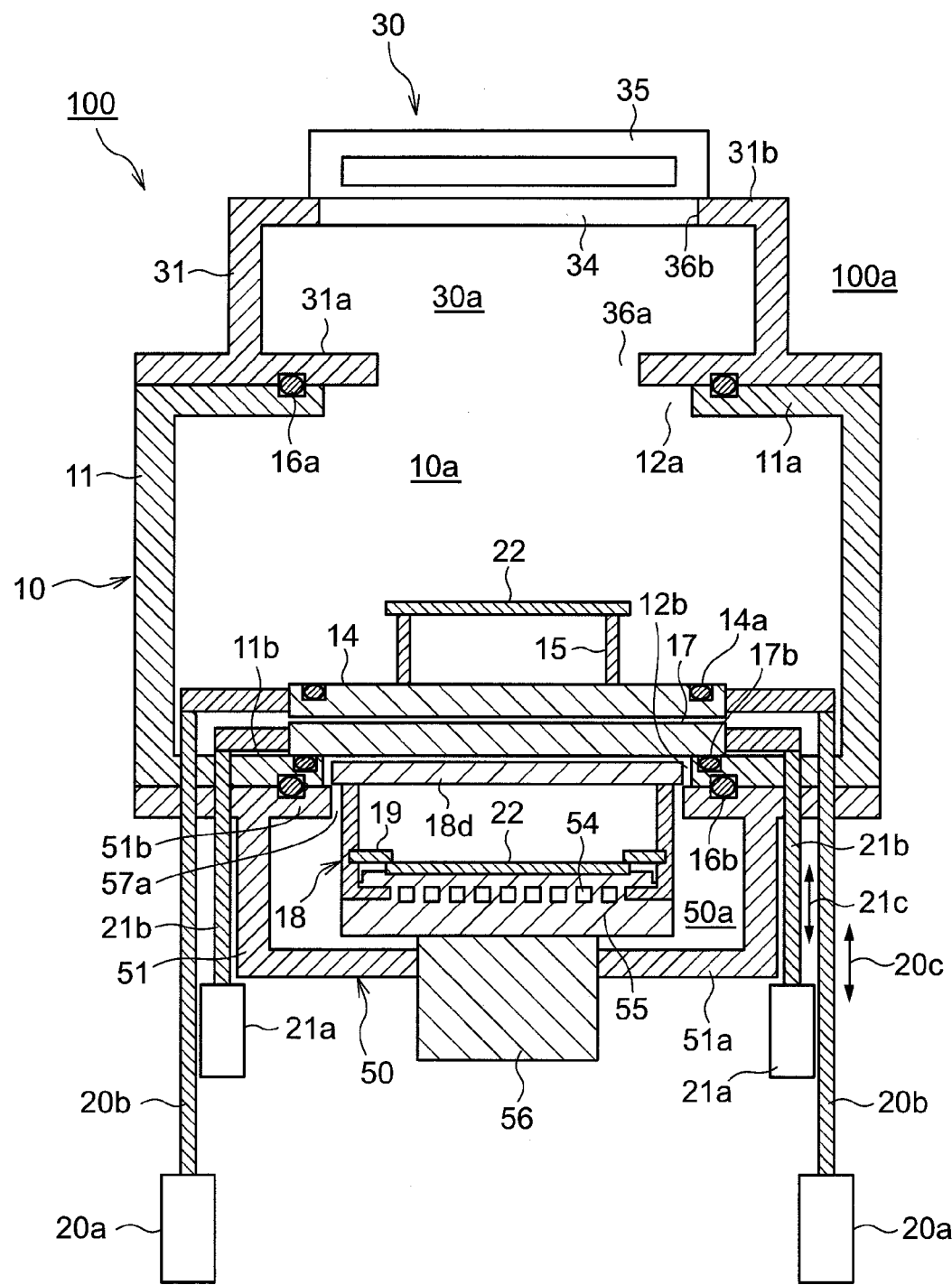
FIG. 3 is a schematic vertical cross-section taken on line B-B of FIG. 1.

Referring to FIG. 2 and FIG. 3, the chamber assembly 100 includes a transfer chamber 10, a process chamber 30, and a process chamber 50. The process chamber 30 is stacked vertically above the transfer chamber 10, and the transfer chamber 10 is stacked vertically above the process chamber 50.

The transfer chamber 10 includes side wall 11 and a top wall 11a and a bottom wall 11b. There is an opening 12c provided in a side wall 11c on the transfer-core-chamber-70 side out of the side walls 11. A gate valve 61 is attached to the side wall 11c in alignment with the opening 12c. The gate valve 61 is opened, and the substrate 22 is transferred through the opening 12c between the transfer core chamber 70 and the transfer chamber 10.

The transfer chamber 10 is provided with a vertical transfer elevator valve 14, a vertical transfer elevator valve 17, a substrate mounting member 15, a substrate mounting member 18, and a substrate mask 19. The transfer chamber 10 is provided with an opening 12d on the side wall 11d side, which is the opposite side to the side wall 11c, out of the side walls 11. A high vacuum pump 13 is attached to the side wall 11d through the opening 12d. A roughing vacuum pipe 13a that is connected to a roughing vacuum pump (not illustrated in the drawings) is connected to the high vacuum pump 13.

An opening 12a is provided in the top wall 11a. The opening 12a is larger than the substrate 22. An O-ring 14a is provided on the top face of the vertical transfer elevator valve 14. The vertical transfer elevator valve 14 may be raised and make a junction with the top wall 11a and seals the opening 12a through the O-ring 14a (see FIG. 2). The substrate mounting member 15 is provided on the vertical transfer elevator valve 14. The opening 12a is larger than the substrate mounting member 15.

An opening 12b is provided in the bottom wall 11b. The opening 12b is larger than the substrate 22. An O-ring 17b is provided on the top face of the bottom wall 11b. The vertical transfer elevator valve 17 may be lowered and make a junction with the bottom wall 11b and seal the opening 12b with the O-ring 17b (see FIG. 3). The substrate mounting member 18 is provided below the vertical transfer elevator valve 17 and actuated independently from the vertical transfer elevator valve 17. The opening 12b is larger than the substrate mounting member 18.

The process chamber 30 includes side walls 31, a top wall 31b and a bottom wall 31a.

An opening 36a is provided in the bottom wall 31a. The opening 36a communicates with the opening 12a of the top wall 11a. The opening 36a is provided in the same horizontal direction position as the opening 12a of the top wall 11a of the transfer chamber 10. The opening 36a is larger than the substrate 22. A gas inlet 32 is provided in the side walls 31 to introduce gas into the process chamber 30. Oxygen gas, for example, is introduced through the gas inlet 32.

An opening 36b and an opening 36c are provided in the top wall 31b. A transparent window 34 made of quartz is attached to the opening 36b. A lamp heater unit 35 is provided above the transparent window 34. A high vacuum pump 33 is attached through the opening 36c to the top wall 31b. A roughing vacuum pipe 33a that is connected to a roughing vacuum pump (not illustrated in the drawings) is connected to the high vacuum pump 33.

The process chamber 50 includes side walls 51, a top wall 51b and a bottom wall 51a.

An opening 57a is provided in the top wall 51b. The opening 57a communicates with the opening 12b of the bottom wall 11b. The opening 57a is provided at the same position along horizontal direction to the opening 12b of the bottom wall 11b of the transfer chamber 10. The opening 57a is larger than the substrate 22. A gas inlet 52 is provided in the side walls 51 to introduce gas into the process chamber 50.

A cryopump 56 is provided through the bottom wall 51a. A substrate holder 55 is provided above the cryopump 56. A heater 54 is provided inside the substrate holder 55. The substrate holder 55 is thermally coupled to the cryopump 56 and the heater 54.

A high vacuum pump 53 is attached to the bottom wall 51a through an opening 57b. A roughing vacuum pipe 53a connected to a roughing vacuum pump (unillustrated) is connected to the high vacuum pump 53.

A space 10a inside the transfer chamber 10, a space 30a inside the process chamber 30, and a space 50a inside the process chamber 50 are vacuum sealed from an external environment 100a by an O-ring 16a provided on the periphery of the opening 36a and the opening 12a, and by an O-ring 16b provided on the periphery of the opening 12b and the opening 57a. The O-ring 16a and the O-ring 16b are made of an elastomer or a metal.

The chamber spaces 10a, 30a, 50a are placed in communication with each other or separated from each other depending on the positions of the vertical transfer elevator valves 14, 17. The chamber space 10a and the chamber space 30a are separated from each other when the vertical transfer elevator valve 14 rises and the opening 12a of the top wall 11a of the transfer chamber 10 is closed off by the vertical transfer elevator valve 14 (see FIG. 2). The chamber space 10a and the chamber space 30a are in communication with each other when the vertical transfer elevator valve 14 is lowered and the opening 12a opened (see FIG. 3). The chamber space 10a and the chamber space 50a are separated from each other when the vertical transfer elevator valve 17 is lowered and the opening 12b of the bottom wall 11b of the transfer chamber 10 is closed off by the vertical transfer elevator valve 17 (see FIG. 3). The chamber space 10a and the chamber space 30a are in communication with each other when the vertical transfer elevator valve 17 rises and the opening 12b is opened (see FIG. 2).

Figure 4:
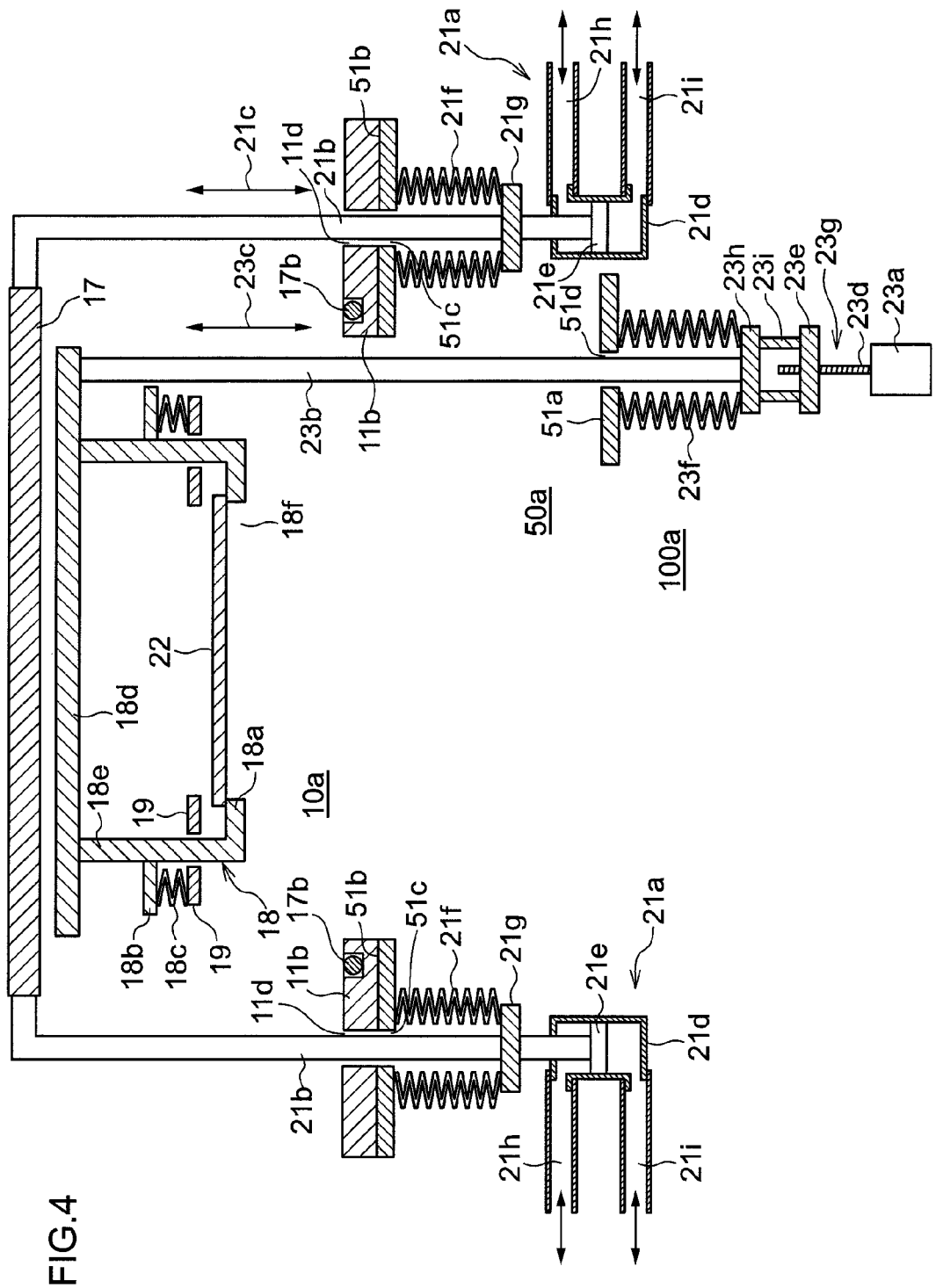
FIG. 4 is a schematic vertical cross-section to explain drive mechanisms for an elevator valve and a substrate mounting member of a substrate processing apparatus of the preferable first exemplary embodiment of the present invention.

Referring to FIG. 4, upper ends of two rods 21b, 21b are respectively attached at two ends of the vertical transfer elevator valve 17. The lower ends of the rods 21b, 21b are attached to pistons 21e, 21e of air cylinders 21a, 21a. The air cylinders 21a are double-acting cylinders. The air cylinders 21a include a cylinder 21d, a piston 21e provided inside the cylinder 21d, an air supply/exhaust port 21h that supplies air to or exhausts air from one end of the cylinder 21d, and an air supply/exhaust port 21i that supplies air to or exhausts air from the other end of the cylinder 21d.

The pistons 21e are moved downwards by supplying air to the air supply/exhaust ports 21h and exhausting air from the air supply/exhaust ports 21i, and as a result the rods 21b that are attached to the pistons 21e are moved downwards, moving the vertical transfer elevator valve 17 downwards. The pistons 21e are moved upwards by supplying air to the air supply/exhaust ports 21i and exhausting air from the air supply/exhaust ports 21h, and as a result the rods 21b that are attached to the pistons 21e are moved upwards, moving the vertical transfer elevator valve 17 upwards. The vertical transfer elevator valve 17 is thus moved up and down by the air cylinders 21a, 21a in the directions of arrow 21c.

The rods 21b are provided so as to pass through openings 11d in the bottom wall 11b of the transfer chamber 10 and through openings 51c in the top wall 51b of the process chamber 50. A plate 21g is attached part way along each of the rods 21b. The plate 21g is provided below the top wall 51b. One end of bellows 21f is attached to the plate 21g, and the other end of the bellows 21f is attached to the top wall 51b. The inside of the bellows 21f is part of the space 10a inside the transfer chamber 10, and the outside of the bellows 21f is part of the external environment 100a. The space 10a inside the transfer chamber 10 is hermetically sealed from the external environment 100a by the bellows 21f. Movement of the plate 21g in the up-down direction is secured by using the bellows 21f, and as a result movement in the up-down direction is secured of the rods 21b that are attached to the plates 21g.

Referring again to FIG. 4, one end of a rod 23b is attached to a top plate 18d of the substrate mounting member 18. The other end of the rod 23b is attached to a plate 23h. The plate 23h is attached to a nut 23e of a ball screw 23g through a support pillar 23i. The lower end of a threaded shaft 23d of the ball screw 23g is attached to a motor 23a. When the motor 23a is actuated, the threaded shaft 23d rotates, and the nut 23e moves up or down according to the rotation direction of the threaded shaft 23d. The plate 23h, the rod 23b and the substrate mounting member 18, which are attached to the nut 23e, accordingly also move up or down. In this way, the substrate mounting member 18 is raised or lowered in the directions of arrow 23c by the motor 23a.

The rod 23b is provided so as to pass through an opening 51d in the bottom wall 51a of the process chamber 50. One end of bellows 23f is attached to the plate 23h, and the other end of the bellows 23f is attached to the bottom wall 51a. The inside of the bellows 23f is part of the space 50a of the process chamber 50, and the outside of the bellows 23f is part of the external environment 100a, with the space 50a of the process chamber 50 hermetically sealed by the bellows 23f from the external environment 100a. The up-down direction movement of the plate 23h is secured by using the bellows 23f, and as a result the up-down direction movement of the rod 23b attached to the plate 23h is also secured.

Figure 5:
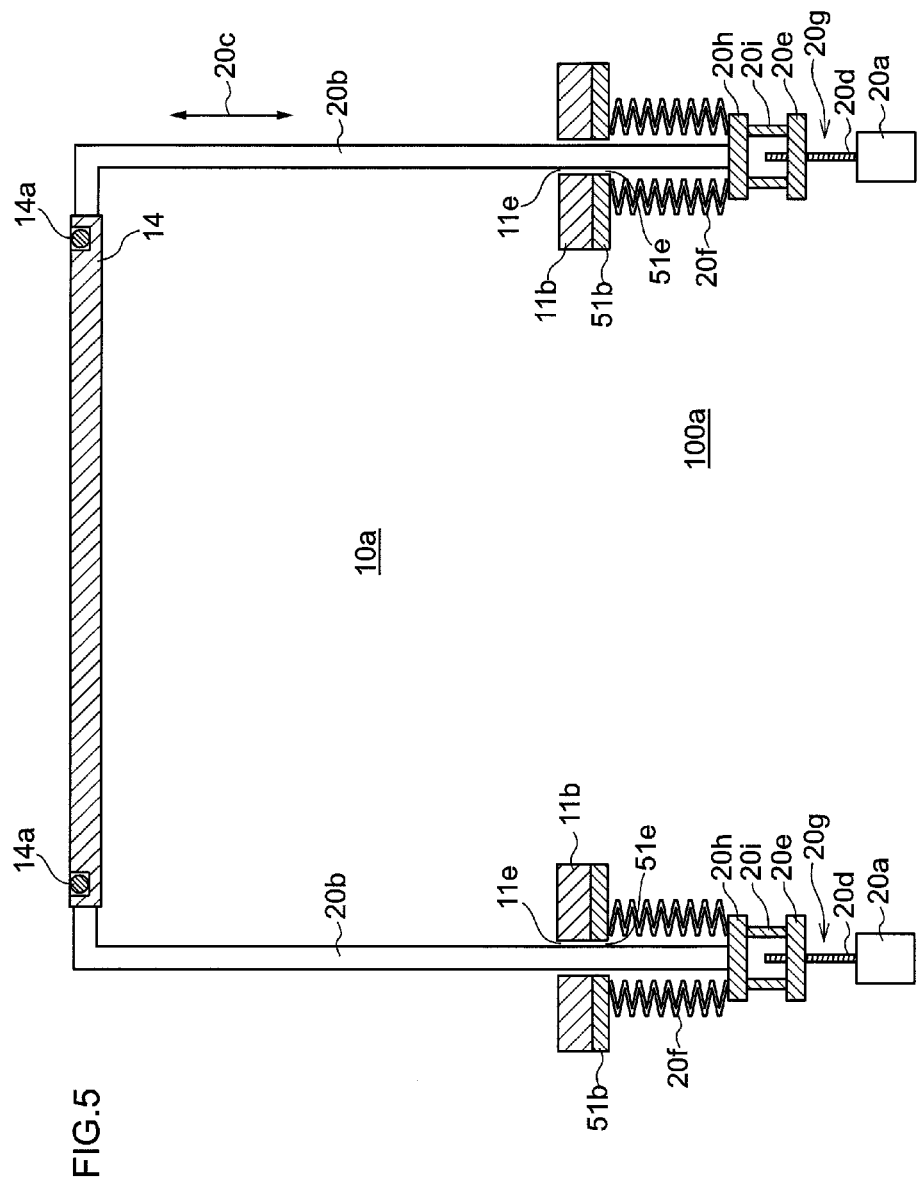
FIG. 5 is a schematic vertical cross-section to explain the drive mechanism of the elevator valve of the substrate processing apparatus of the preferable first exemplary embodiment of the present invention.

Referring to FIG. 5, upper ends of two rods 20b, 20b are respectively attached to the edges of the vertical transfer elevator valve 14. The lower ends of the rods 20b, 20b are attached to a plate 20h. The plate 20h is attached to a nut 20e of a ball screw 20g through a main pillar 20i. The lower end of a threaded shaft 20d of the ball screw 20g is attached to a motor 20a. When the motor 20a rotates, the threaded shaft 20d also rotates, and the nut 20e is actuated according to the rotation direction of the threaded shaft 20d. The plate 20h, the rods 20b and the vertical transfer elevator valve 14, which are attached to the nut 20e, accordingly also move up or down. The vertical transfer elevator valve 14 is accordingly caused to move up or down in the directions of the arrow 20c by the motor 20a.

The rods 20b are provided so as to pass through openings 11e in the bottom wall 11b of the transfer chamber 10, and through openings 51e in the top wall 51b of the process chamber 50. One end of bellows 20f is attached to the plate 20h and the other end of the bellows 20f is attached to the top wall 51b. Inside of the bellows 20f is part of the space 10a of the transfer chamber 10, and outside of the bellows 20f is part of the external environment 100a, and the space 10a of the transfer chamber 10 is hermetically sealed from the external environment 100a by the bellows 20f. Up-down direction movement of the plate 20h is secured by using the bellows 20f, and as a result, up-down direction movement of the rods 20b attached to the plate 20h is also secured.

Figure 6:
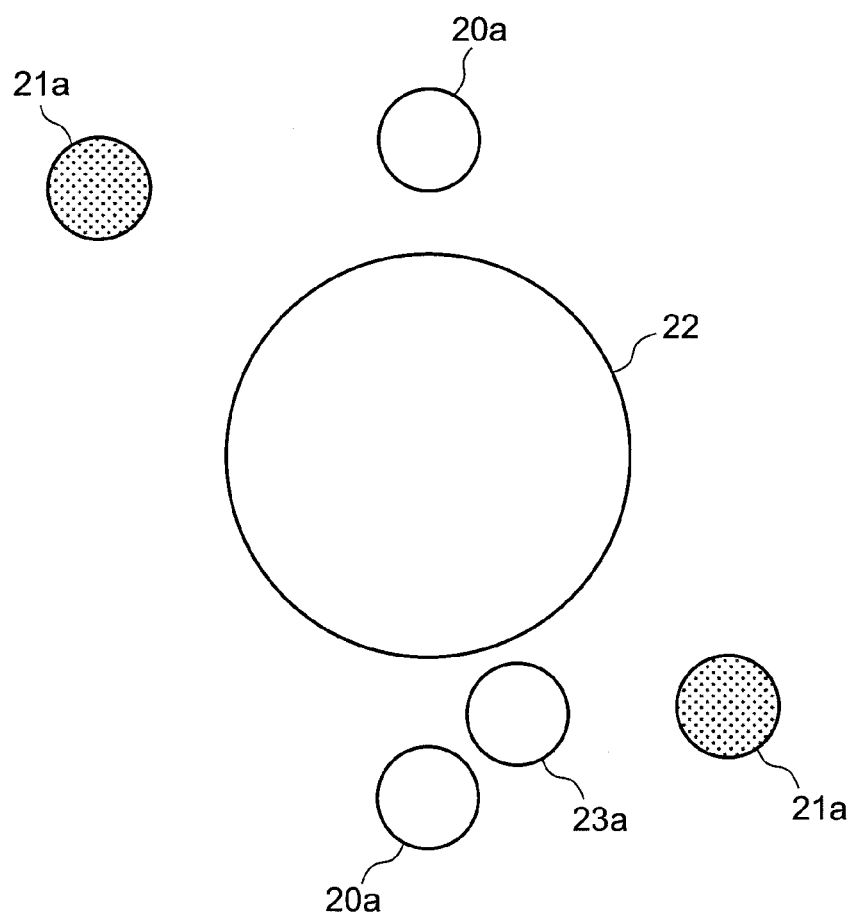
FIG. 6 is a schematic horizontal cross-section to explain a plan view layout of the elevator valve and the substrate mounting member of the substrate processing apparatus of the preferable first exemplary embodiment of the present invention.

Referring to FIG. 6, the motors 20a, 20a for moving the vertical transfer elevator valve 14 in the up-down direction are disposed at two sides of the substrate 22. The air cylinders 21a, 21a that move the vertical transfer elevator valve 17 in the up-down direction are disposed at the two sides of the substrate 22 and tilted by a specific angle with respect to a line connecting together the motors 20a, 20a. The motor 23a that moves the substrate mounting member 18 in the up-down direction is disposed between one of the motors 20a and one of the air cylinders 21a.

The substrate mounting member 15 is equipped with plural pins. The substrate 22 is mounted on the plural pins. The substrate mounting member 15 is provided above the vertical transfer elevator valve 14. Therefore when the vertical transfer elevator valve 14 rises, the substrate mounting member 15 also rises. The substrate mounting member 15 and the substrate 22 are positioned inside the space 30a of the process chamber 30 (see FIG. 2) when the vertical transfer elevator valve 14 has joined to the top wall 11a and sealed off the opening 12a. Processing of the substrate 22 inside the process chamber 30 is performed in this state. When the vertical transfer elevator valve 14 is lowered, the substrate mounting member 15 is also lowered, and the substrate mounting member 15 and the substrate 22 are positioned inside the space 10a of the transfer chamber 10 (see FIG. 3). In the state in which the substrate mounting member 15 and the substrate 22 are positioned at a substrate pass-over position inside the transfer chamber 10, the substrate 22 is mounted from the transfer core chamber 70 onto the substrate mounting member 15, or the substrate 22 mounted on the substrate mounting member 15 is transferred into the transfer core chamber 70, by the substrate transfer robot 90 inside the transfer core chamber 70.

Figure 7:
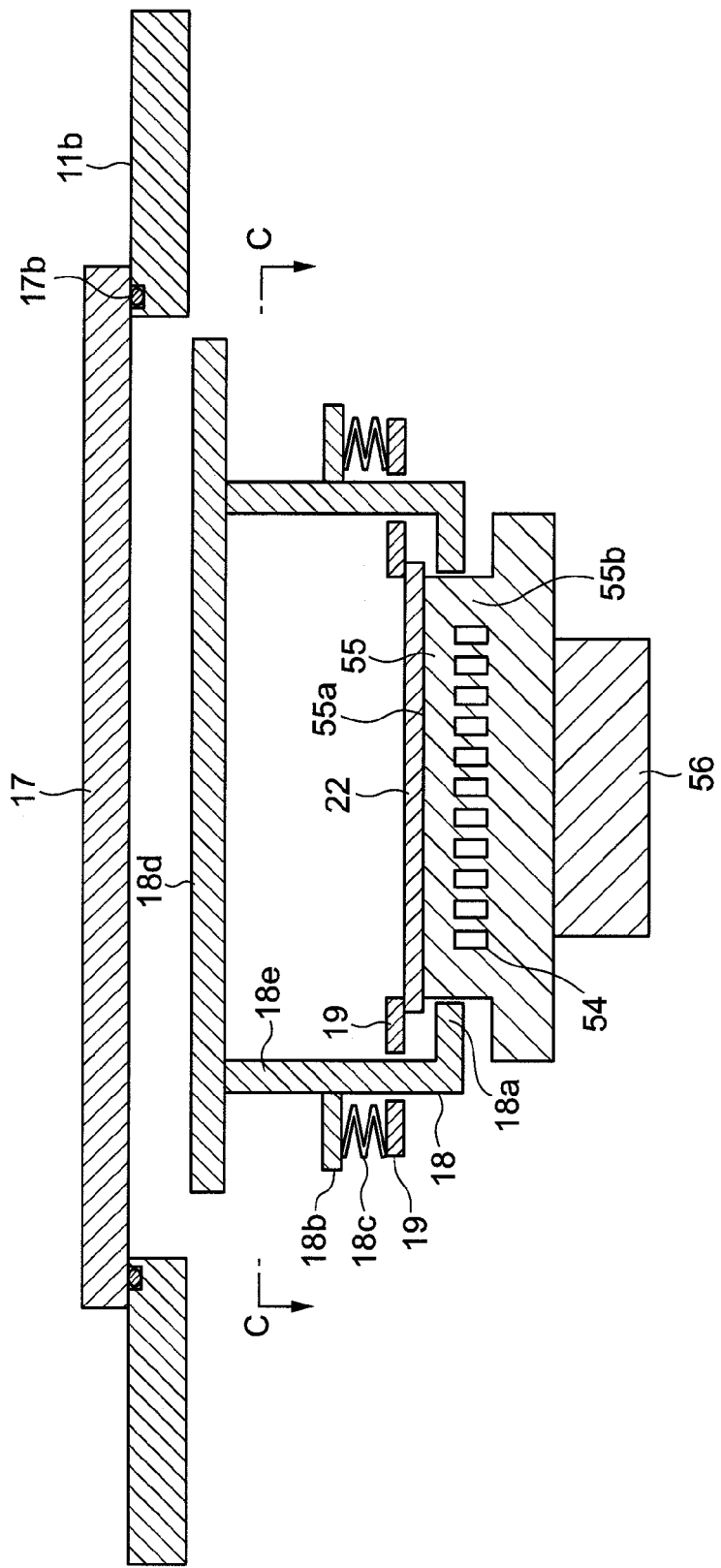
FIG. 7 is a schematic vertical cross-section to explain the substrate mounting member of the substrate processing apparatus according to the preferable first exemplary embodiment of the present invention.
Figure 8:
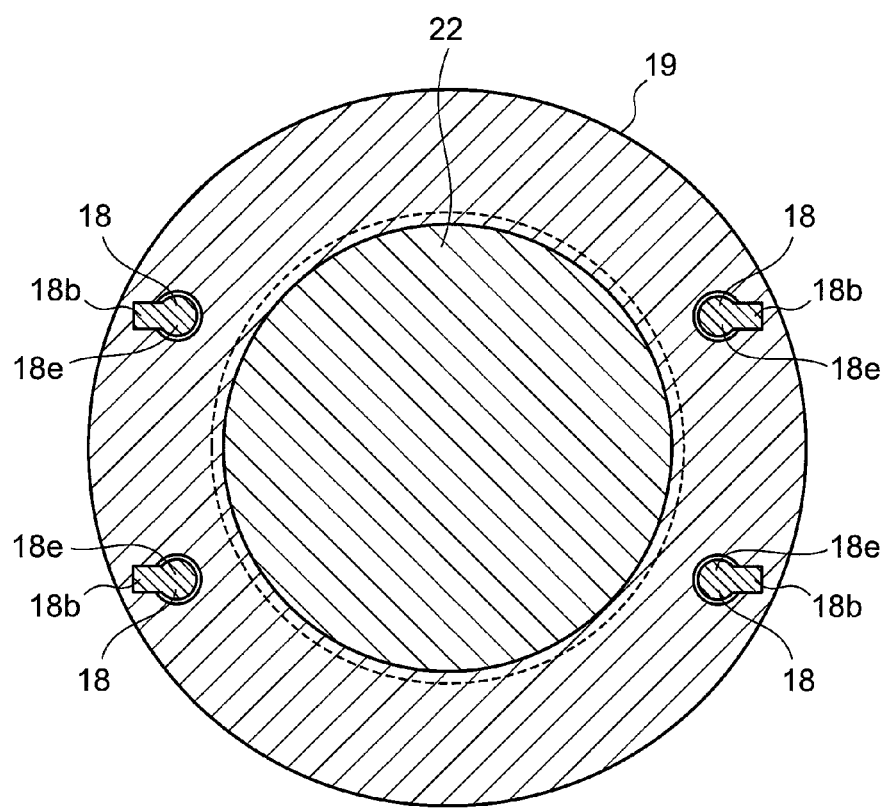
FIG. 8 is a schematic horizontal cross-section to explain the substrate mounting member of the preferable first exemplary embodiment of the present invention.

Referring to FIG. 4, FIG. 7 and FIG. 8, the substrate mounting member 18 includes the top plate 18d, downward facing four pins 18e that are attached to the top plate 18d, substrate bearing portions 18a that are provided to leading ends of the pins 18e so as to extend out horizontally from the pins 18e towards the inside, spring fixing members 18b that are provided partway along the pins 18e so as to extend out horizontally from the pins 18e towards the outside, and spring members 18c with top ends are attached to the spring fixing members 18b. The bottom ends of the spring members 18c are attached to the substrate mask 19. The substrate mask 19 is formed in a ring shape.

Referring to FIG. 4, the top plate 18d of the substrate mounting member 18 is attached to the rod 23b, and when the motor 23a is actuated and the rod 23b rises, the substrate mounting member 18 also rises, and the substrate mounting member 18 and the substrate 22 are positioned inside the space 10a of the transfer chamber 10 (see FIG. 2 and FIG. 4). In order to close off the opening 12b of the bottom wall 11b of the transfer chamber 10 using the vertical transfer elevator valve 17 and to separate the chamber space 10a and the chamber space 50a from each other (see FIG. 3), the air cylinders 21a are driven and the vertical transfer elevator valve 17 is raised in advance.

When the substrate mounting member 18 is raised, the substrate 22 is no longer mounted on the substrate holder 55 and is held by the substrate bearing portions 18a. Moreover, since the substrate mask 19 is suspended by spring members 18c, the substrate mask 19 is separated from the substrate 22. In a state in which the substrate mounting member 18 and the substrate 22 are positioned at a specific substrate transferring position in the transfer chamber 10, the substrate 22 is transferred from the transfer core chamber 70 onto the substrate bearing portions 18a of the substrate mounting member 18. The substrate 22 on the substrate bearing portions 18a of the substrate mounting member 15 may also be transferred to the core chamber 70, by the substrate transfer robot 90 inside the transfer core chamber 70.

Referring to FIG. 3 and FIG. 7, when the substrate mounting member 18 is lowered, a raised portion 55b of the substrate holder 55 is surrounded by the four substrate bearing portions 18a. When the position of a front face 55a of the raised portion 55b is higher than the position of the substrate bearing portions 18a, the substrate 22 transitions from a state being mounted on the four substrate bearing portions 18a to a state of being mounted on the substrate holder 55. When the substrate mounting member 18 is further lowered, the substrate mask 19 presses the substrate edge. To close the chamber 10, the air cylinders 21a are actuated, the vertical transfer elevator valve 17 is lowered, and the opening 12b of the bottom wall 11b of the transfer chamber 10 is closed off by the vertical transfer elevator valve 17, separating the chamber space 10a and the chamber space 50a from each other, and processing of the substrate 22 is performed inside the process chamber 50.

Note that although in the present exemplary embodiment the substrate mounting member 18 is provided to a lower portion of the vertical transfer elevator valve 17, there is no limitation thereto. For example, plural pins (for example 3 pins) capable of moving up or down may be provided inside the substrate holder 55 to support the substrate.

Although in the present embodiment, the transparent window 34 and the lamp heater unit 35 are provided to the top wall 31b of the process chamber 30, in place of the transparent window 34 and the lamp heater unit 35, a sputtering cathode and target, which are positioned parallel to the substrate 22, may be disposed on the top wall 31b, a plasma etching induction coil and dielectric window may be provided, a gas shower head for use in metal thin film oxidation may be provided, or an extremely low temperature cooling plate may be provided which is disposed in the vicinity of the substrate for use in rapid cooling. Various processing may be performed in the process chamber 30 by such equipment provided to the top wall 31b. Note that in plasma etching, preferably the substrate mounting member 15 above the vertical transfer elevator valve 17 is replaced with a stage provided with a flat face in order to maintain the temperature of the substrate.

In the present exemplary embodiment, the cryopump 56 is provided to the bottom wall 51a of the process chamber 50 to enable extremely low temperature cooling, and the heater 54 is provided inside the substrate holder 55 so as to enable the cooling temperature to be adjusted. However configuration may be made to enable reverse sputtering etching to be performed inside the process chamber 50 by providing below the substrate holder 55, separately to the cryopump 56 and the heater 54, an electrode and water channel to prevent heating. The vertical transfer elevator valve 17 may also be configured as a shower head for introducing a reactive gas for performing etching and oxidation processing.

Explanation next follows regarding a method of processing the substrate 22 by using the substrate processing apparatus 1 of the present exemplary embodiment. A typical substrate processing process includes the following processes.

Referring to FIG. 1, first a cassette loaded with plural substrates 22 (not illustrated in the drawings) is inserted into the FOUP unit 72a. The substrate transfer robot 92 of the front end module 72 then transfers the substrate 22 from the FOUP unit 72a to the load lock chamber 71a.

The gate valve 74f present between the front end module 72 and the load lock chamber 71a is then closed, and the load lock chamber 71a exhausted.

Then, after opening the slit valve 74d between the load lock chamber 71a and the transfer core chamber 70, the substrate transfer robot 90 inside the transfer core chamber 70 takes the substrate 22 from the load lock chamber 71a, opens the gate valve 74a and transfers the substrate 22 into the process chamber 73a. The gate valve 74a is then closed and processing performed on the substrate 22 in the process chamber 73a.

When processing of the substrate 22 in the process chamber 73a has been completed, the gate valve 74a is opened, and the substrate transfer robot 90 takes the substrate 22 out from the process chamber 73a, closes the gate valve 74a, and introduces the substrate 22 into the process chamber 73b. The gate valve 74b is then closed, and processing of the substrate 22 is performed in the process chamber 73b.

When processing of the substrate 22 in the process chamber 73b has been completed, the gate valve 74b is opened, and the substrate transfer robot 90 takes the substrate 22 out from the process chamber 73b, opens the gate valve 61, and introduces the substrate 22 into the transfer chamber 10 of the chamber assembly 100.

Referring to FIG. 3, in order to perform processing of the substrate 22 in the process chamber 30, the vertical transfer elevator valve 17 is lowered in advance, and the opening 12b of the bottom wall 11b of the transfer chamber 10 is closed by the vertical transfer elevator valve 17, thereby separating the chamber space 10a from the chamber space 50a. Then in order to load the substrate 22 into the transfer chamber 10, the vertical transfer elevator valve 14 is lowered, and in a state in which the substrate mounting member 15 is positioned at the specific substrate pass-over position inside the transfer chamber 10, the substrate 22 is mounted onto the substrate mounting member 15 by an end effector 90b (see FIG. 2) of the substrate transfer robot 90 inside the transfer core chamber 70. When this is being performed, the substrate 22 is loaded onto the end effector 90b, and the substrate 22 is transferred to slightly above the substrate mounting member 15, then either the vertical transfer elevator valve 14 is raised so as to raise the substrate mounting member 15, or the end effector 90b is lowered. The substrate 22 mounted on the end effector 90b is accordingly switched to be placed on the substrate mounting member 15, and then the end effector 90b is returned to inside the transfer core chamber 70. The gate valve 61 is then closed.

Then the vertical transfer elevator valve 14 is raised, and the vertical transfer elevator valve 14 is joined to the top wall 11*a* and the opening 12*a* is sealed. When this occurs the substrate mounting member 15 and the substrate 22 are positioned inside the space 30*a* within the process chamber 30 (see FIG. 2). Processing of the substrate 22 in the process chamber 30 is performed in this state. In the present exemplary embodiment, for example, heat processing of the substrate 22 is performed by the lamp heater unit 35.

When the processing of the substrate 22 in the process chamber 30 is completed, the vertical transfer elevator valve 14 is lowered, lowering the substrate mounting member 15, and the substrate mounting member 15 and the substrate 22 are positioned at the specific substrate pass-over position inside the space 10*a* of the transfer chamber 10. The gate valve 61 is then opened, and the substrate 22 on the substrate mounting member 15 is taken out from the process chamber 30 by the end effector 90*b* of the substrate transfer robot 90 inside the transfer core chamber 70 (see FIG. 2). When this is being performed, in a state in which the bottom portion of the substrate 22 on the substrate mounting member 15 is positioned at a higher position than the end effector 90*b*, and the end effector 90*b* is positioned below the substrate 22, the vertical transfer elevator valve 14 is lowered to lower the substrate mounting member 15, or the end effector 90*b* is raised, thereby switching the substrate 22 from being mounted on the substrate mounting member 15 to being placed on the end effector 90*b*. The end effector 90*b* mounted with the substrate 22 is then returned into the transfer core chamber 70. The gate valve 61 is then closed.

Referring to FIG. 2, in order to perform processing of the substrate 22 in the process chamber 50, the vertical transfer elevator valve 14 is raised in advance, and the opening 12*a* of the top wall 11*a* of the transfer chamber 10 is closed off by the vertical transfer elevator valve 14, thereby separating the chamber space 10*a* from the chamber space 30*a*. In order to transfer the substrate 22 into the transfer chamber 10, the vertical transfer elevator valve 17 is raised, the substrate mounting member 18 is also raised, and in a state with the substrate mounting member 18 positioned at the specific substrate pass-over position inside the transfer chamber 10, the substrate 22 is mounted onto the substrate mounting member 18 by the end effector 90*b* of the substrate transfer robot 90 in the transfer core chamber 70.

Referring to FIG. 4, when this is being performed, the substrate 22 mounted on the end effector 90*b* is transferred to be positioned slightly above the substrate bearing portions 18*a* of the substrate mounting member 18 and below the substrate mask 19. The substrate mounting member 18 is then raised to raise the substrate bearing portions 18*a*, or the end effector 90*b* is lowered, and the substrate 22 mounted on the end effector 90*b* switches to being mounted on the substrate bearing portions 18*a*, and the end effector 90*b* is then returned to inside the transfer core chamber 70. The gate valve 61 is then closed.

Referring to FIG. 3 and FIG. 7, thereafter, when the substrate mounting member 18 is lowered, the raised portion 55*b* of the substrate holder 55 is surrounded by inside the four substrate bearing portions 18*a*, and when the position of the front face 55*a* of the raised portion 55*b* is higher than the position of the substrate bearing portions 18*a*, the substrate 22 is mounted on the substrate holder 55. The substrate mounting member 18 is then further lowered, such that the periphery of the substrate 22 is in a nipped state between the substrate mask 19 and the four substrate bearing portions 18*a*. When this is performed, the substrate 22 is pressed downwards by the substrate mask 19 attached to the spring members 18*c*.

Subsequently, the vertical transfer elevator valve 17 is lowered in this state, and the opening 12*b* of the bottom wall 11*b* of the transfer chamber 10 is closed off by the vertical transfer elevator valve 17, thereby separating the chamber space 10*a* from the chamber space 50*a*, and then processing of the substrate 22 is performed inside the process chamber 50.

When processing of the substrate 22 inside the process chamber 50 has been completed, the vertical transfer elevator valve 17 is raised, raising the substrate mounting member 18. Referring to FIG. 2 and FIG. 4, when the substrate mounting member 18 is raised a state is adopted in which the substrate 22 is not mounted on the substrate holder 55, but is instead mounted on the substrate bearing portions 18*a*. The substrate mask 19 is suspended by the spring members 18*c*, so the substrate mask 19 is separated from the substrate 22. In a state in which the substrate mounting member 18 and the substrate 22 are positioned at the specific substrate transfer position inside the transfer chamber 10, the gate valve 61 is then opened. The substrate 22 mounted on the substrate mounting member 18 is then taken out from the transfer chamber 10 by the end effector 90*b* of the substrate transfer robot 90 inside the transfer core chamber 70 (see FIG. 2). Referring to FIG. 4, in a state in which the bottom portion of the substrate 22 mounted on the substrate mounting member 18 is positioned at a higher position than the end effector 90*b*, and the end effector 90*b* is positioned at the lower side of the substrate 22, the substrate mounting member 18 is lowered, or the end effector 90*b* is raised, and the substrate 22 mounted on the substrate mounting member 18 switches to being mounted on the end effector 90*b*. Then the end effector 90*b* mounted with the substrate 22 returns to inside the transfer core chamber 70. The gate valve 61 is then closed.

In the present exemplary embodiment, the vertical transfer elevator valves 14, 17 separate the process chambers 30, 50 from the transfer chamber 10, thereby enabling contamination to be prevented when reactive gas is employed in one or both of the process chambers 30, 50. When not under a low vacuum or not using a reactive gas, pumping may be performed from one or both of the process chambers 30, 50 by using the high vacuum pump 13 of the transfer chamber 10 by slightly retreating the vertical transfer elevator valves 14, 17 respectively from the openings 12*a*, 12*b* of the transfer chamber 10.

Referring again to FIG. 1, the gate valve 61 is opened, and the substrate transfer robot 90 receives the substrate 22 from the transfer chamber 10 of the chamber assembly 100, the gate valve 74*c* is opened, and the substrate 22 is introduced into the process chamber 73*c*. The gate valve 74*c* is then closed, and processing of the substrate 22 is performed in the process chamber 73*c*.

When the processing of the substrate 22 in the process chamber 73*c* is completed, the gate valve 74*c* is opened, and the substrate transfer robot 90 takes the substrate 22 out from the process chamber 73*c*, the slit valve 74*e* between the transfer core chamber 70 and the unload lock chamber 71*b* is opened, and the substrate 22 is introduced into the unload lock chamber 71*b*.

The slit valve 74*e* is then closed, and the unload lock chamber 71*b* returns to atmospheric pressure. The gate valve 74*g* between the unload lock chamber 71*b* and the front end module 72 are then opened, and the substrate transfer robot 92 of the front end module 72 transfers the substrate 22 from the unload lock chamber 71*b* to the FOUP unit 72*a*.

The method of processing a substrate described above has been simplified for explanatory purposes. In reality there are plural of the substrates 22 mounted within the vacuum region of the substrate processing apparatus 1, and in order to optimize throughput a scheduling means is employed to control the substrate transfer sequence, the transfer timing and the times and to manage a recipe.

Second Exemplary Embodiment

Figure 9:
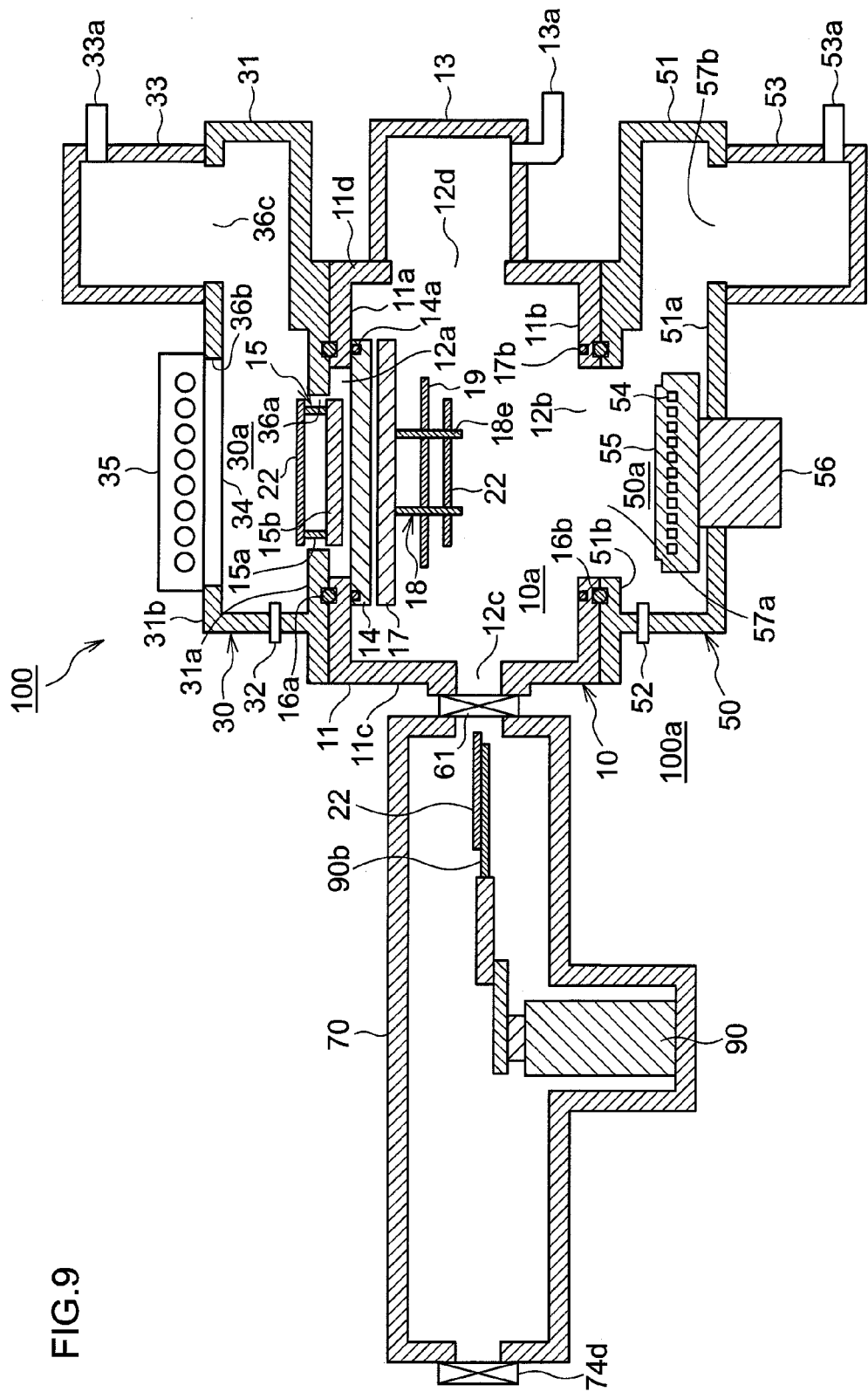
FIG. 9 is a schematic vertical cross-section to explain a substrate processing apparatus of a preferable second exemplary embodiment of the present invention.

In the first exemplary embodiment described above, the substrate mounting member 15 is provided on the vertical transfer elevator valve 14, and the substrate mounting member 15 moves up or down together with the vertical transfer elevator valve 14. However, referring to FIG. 9, the present exemplary embodiment differs from the first exemplary embodiment in the points that: a substrate mounting member 15 is provided above a vertical transfer elevator valve 14 and independently of the vertical transfer elevator valve 14; a drive member of the substrate mounting member 15 is provided separately to the drive member of the vertical transfer elevator valve 14; and up-down movement of the substrate mounting member 15 and up-down movement of the vertical transfer elevator valve 14 are independent of each other. Namely, the substrate mounting member 15 is provided with a plate 15b, and plural pins 15a provided above the plate 15b. The substrate 22 is mounted on the plural pins 15a. The plate 15b is moved up or down by a drive member (not illustrated in the drawings) provided so as to pass through the top wall 31b of the process chamber 30. The drive member is similar to the drive member that drives the top plate 18d of the substrate mounting member 18 up or down in the first exemplary embodiment and so further explanation is omitted thereof.

In the first exemplary embodiment as described above, the substrate mounting member 18 is provided below the vertical transfer elevator valve 17 and independently of the vertical transfer elevator valve 17, and the drive member of the substrate mounting member 15 is provided separately to the drive member of the vertical transfer elevator valve 14. In contrast thereto, in the present exemplary embodiment, the substrate mounting member 18 is provided below the vertical transfer elevator valve 17 and integrally provided to the vertical transfer elevator valve 17. Namely, whereas in the first exemplary embodiment the pins 18e are attached to the top plate 18d (see FIG. 4 and FIG. 7), the substrate mounting member 18 of the present exemplary embodiment does not employ a top plate 18d, and pins 18e are instead attached to the vertical transfer elevator valve 17. The substrate mounting member 18 accordingly also moves up or down with up-down movement of the vertical transfer elevator valve 17.

The present exemplary embodiment differs from the substrate processing apparatus of the first exemplary embodiment in these two points. Other points are however similar to those of the substrate processing apparatus of the first exemplary embodiment, the same reference numerals are allocated thereto, and further explanation is omitted thereof.

Third Exemplary Embodiment

Figure 10:
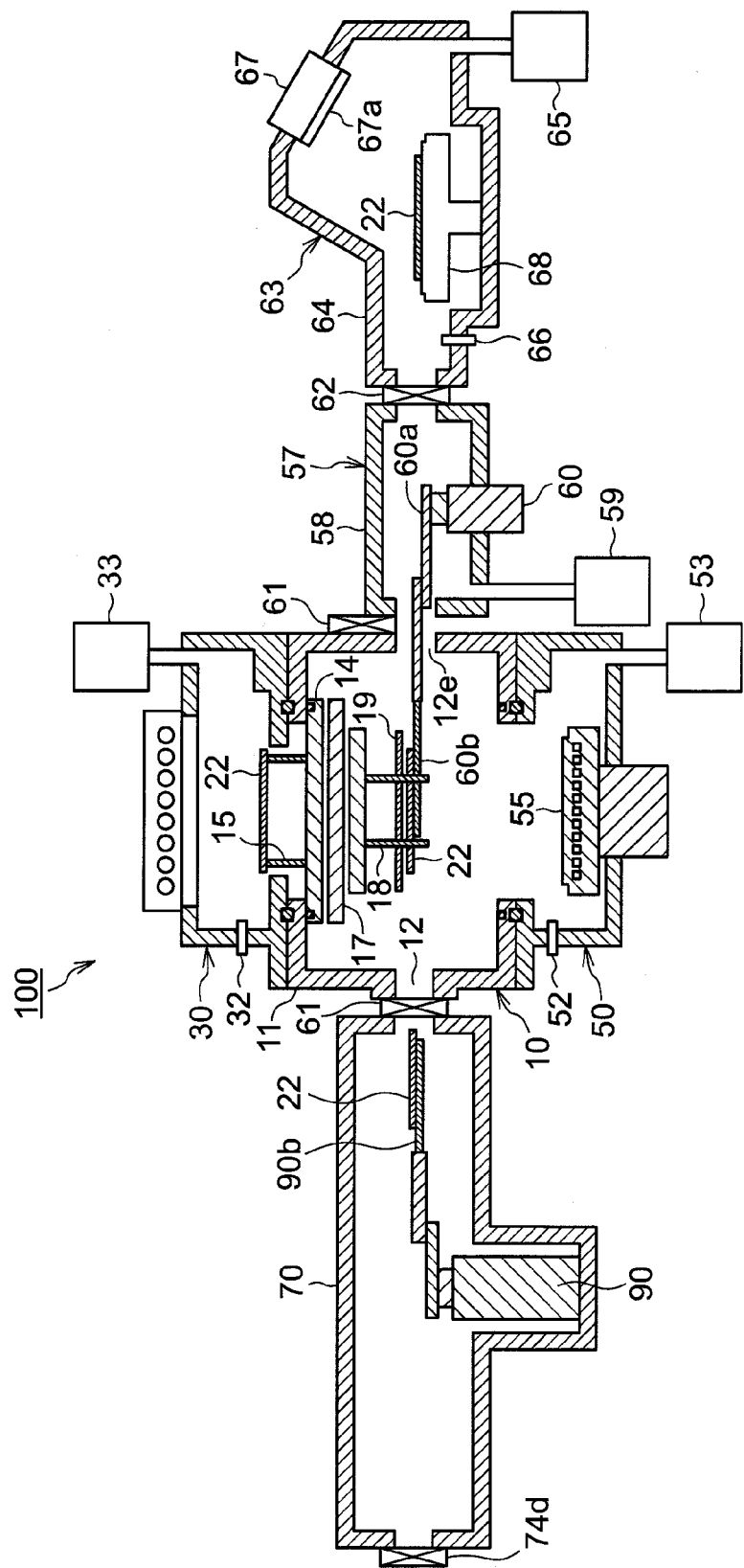
FIG. 10 is a schematic vertical cross-section to explain a substrate processing apparatus of a preferable third exemplary embodiment of the present invention.

A substrate processing apparatus according to a preferable third exemplary embodiment of the present invention has a configuration fundamentally the same as that of the substrate processing apparatus of the first exemplary embodiment, and so the same reference numerals are allocated thereto and further explanation is omitted thereof. As illustrated in FIG. 10, in the preferable third exemplary embodiment of the present invention, the chamber assembly 100 includes a transfer chamber 10, a process chamber 30, and a process chamber 50. The chamber assembly 100 includes a transfer chamber 57 that is connected to the transfer chamber 10 by a gate valve 61, and a process chamber 63 that is connected to the transfer chamber 57 by a gate valve 62.

The transfer chamber 10 includes an opening 12e that is positioned at substantially the same height as an opening 12 in a side wall 11. The gate valve 61 is attached to the side wall 11 so as to align with the opening 12e.

The transfer chamber 57 includes a vacuum container 58, a substrate transfer robot 60 including a robot arm 60a and an end effector 60b, and a vacuum pump 65 for exhaust pumping gas from inside the vacuum container 58.

The process chamber 63 is a sputtering chamber equipped with a vacuum container 64, a gas inlet 66, a vacuum pump 65, a sputtering cathode 67 including a target 67a, a magnet assembly (not illustrated in the drawings) disposed at the back face side of the target 67a, and a stage 68 that holds a substrate 22 and that is capable of rotating about a rotation axis that is orthogonal to the stage front face.

Note that the process chamber 63 is not limited so such a configuration and configuration may be made with a sputtering module that is provided with plural cathodes, or may be made with a plasma etching module.

The substrate 22 is transferred from the transfer chamber 10 to the process chamber 63.

The substrate 22 is directly transferred to the process chamber 63 by passing across from the end effector 90b of the substrate transfer robot 90 of the transfer core chamber 70 to the end effector 60b of the substrate transfer robot 60 inside the transfer chamber 10. Provision of the auxiliary opening 12e thereby enables the transfer chamber 10 to also function as a pass chamber.

Fourth Exemplary Embodiment

Figure 11:
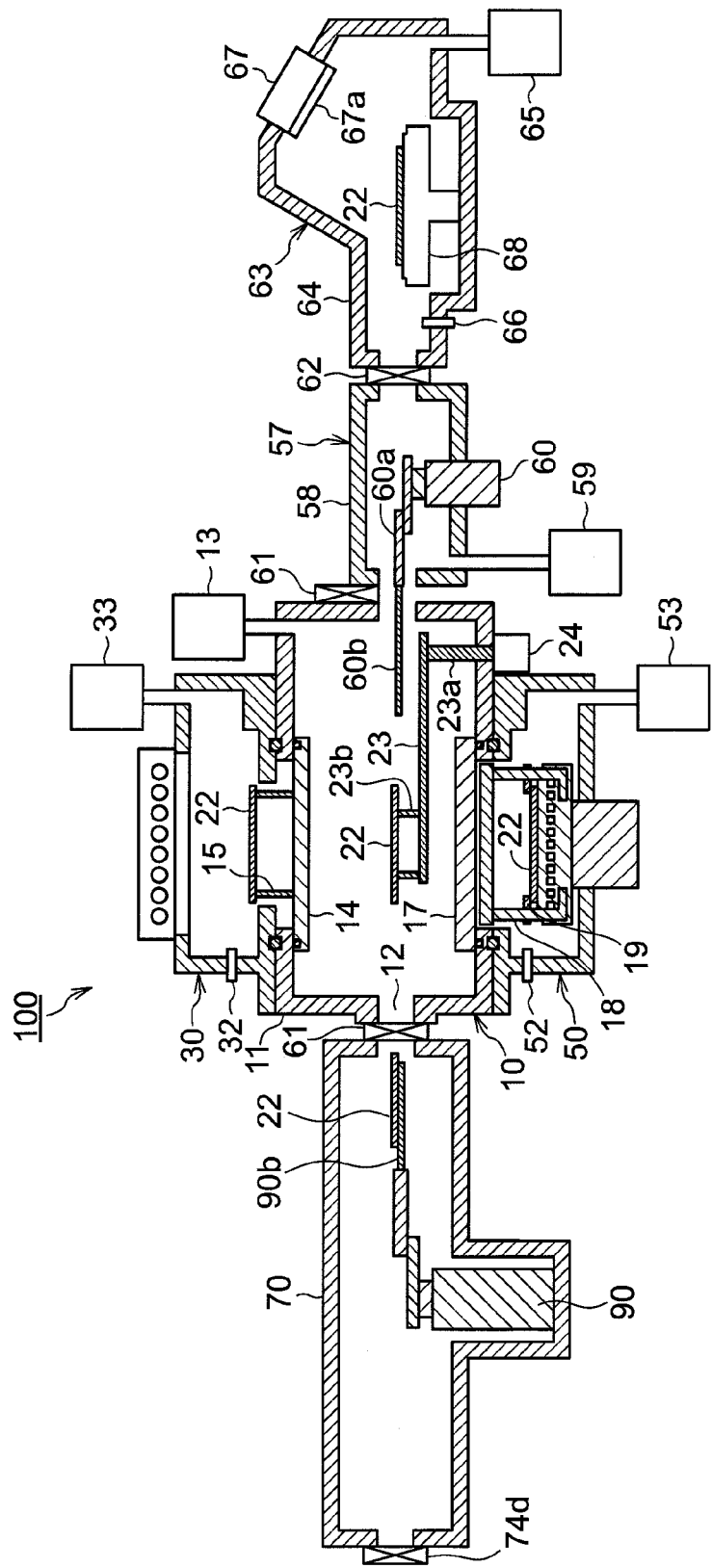
FIG. 11 is a schematic vertical cross-section to explain a substrate processing apparatus of a preferable fourth exemplary embodiment of the present invention.

A substrate processing apparatus according to a preferably fourth exemplary embodiment of the present invention is configured fundamentally the same as the substrate processing apparatus of the third exemplary embodiment, the same reference numerals are allocated thereto and further explanation is omitted thereof. Referring to FIG. 11, a transfer chamber 10 of the substrate processing apparatus according to the present exemplary embodiment differs from the substrate processing apparatus illustrated in FIG. 10, and is equipped with a substrate mounting member 23b equipped with plural pins to support the substrate 22. In the substrate processing apparatus of the present exemplary embodiment, the transfer chamber 10 functions as a pass chamber whilst respectively executing processing of the substrates 22 in the process chamber 30 and the process chamber 50 independently of each other by closing the vertical transfer elevator valves 14, 17.

The substrate mounting member 23b is provided to one end of a substrate arm stage 23. A rotation bar 23a that axially supports the substrate arm stage 23 so as to be capable of rotation is provided to the other end of the substrate arm stage 23. The rotation bar 23a is connected to a rotation mechanism 24 that is provided to an external portion of the transfer chamber 10. Operating the rotation mechanism 24 enables the substrate arm stage 23 to be retracted to a position that does not clash with the vertical transfer elevator valve 14 or the vertical transfer elevator valve 17 moving up or down.

Fifth Exemplary Embodiment

Figure 12:
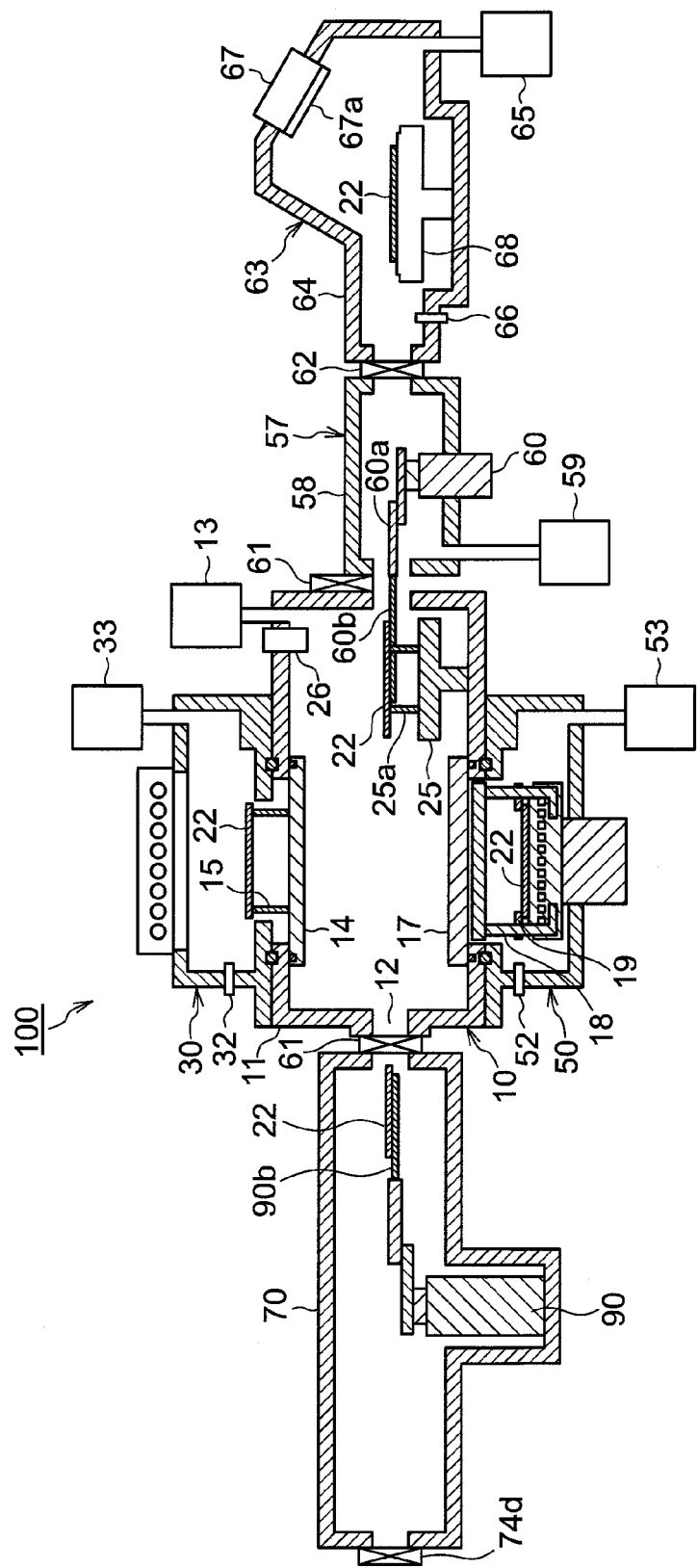
FIG. 12 is a schematic vertical cross-section to explain a substrate processing apparatus of a preferable fifth exemplary embodiment of the present invention.

A substrate processing apparatus according to a preferably fifth exemplary embodiment of the present invention is configured fundamentally the same as the substrate processing apparatus of the third exemplary embodiment, and so the same reference numerals are allocated thereto and further explanation is omitted thereof. Referring to FIG. 12, a transfer chamber 10 of a substrate processing apparatus according to the present exemplary embodiment differs from the substrate processing apparatus illustrated in FIG. 10 and is provided with a rotatable substrate stage 25 that is equipped with a substrate mounting member 25a that includes plural pins for supporting the substrate 22. The pins or the stage 25 are capable of moving up or down. There is also a substrate orientation detection means 26 provided above the substrate stage 25 for detecting the orientation of the substrate. A CCD camera may be employed as the substrate orientation detection means 26, thereby enabling the orientation of the substrate 22 to be identified by detecting notches or orientation flats on the substrate 22. The substrate orientation detection means 26 is capable of transmitting a signal notifying the substrate orientation to a rotation motor of the substrate stage 25, enabling the substrate to be flipped over by 180°.

The transfer chamber 10 according to the present exemplary embodiment does not only function as a pass chamber but also as an alignment chamber. Normally the orientation of the substrate 22 is inverted when the substrate 22 is passed across from a robot to a robot. In order to pass the substrate 22 over with the orientations of the substrate 22 aligned, the stage 25 to rotate the substrate through 180° may be employed.

Modified Examples

In order to provide a pass chamber function to the transfer chamber 10, a substrate mounting member formed from plural pins may be disposed at an upper portion of the vertical transfer elevator valve 17 to support the substrate so as to be capable of being transferred across by the substrate transfer robots 90, 60.

In the exemplary embodiment described above a chamber 58 with a robot is separately provided from the transfer chamber 10, however configuration may be made as a common chamber.

In the exemplary embodiment described above, the transfer chamber 10 is positioned between the process chamber 73b and the process chamber 73c, however there is no limitation thereto, and positioning may be made at the position of the load lock chamber 71a.

Comparative Example 1

Figure 13:
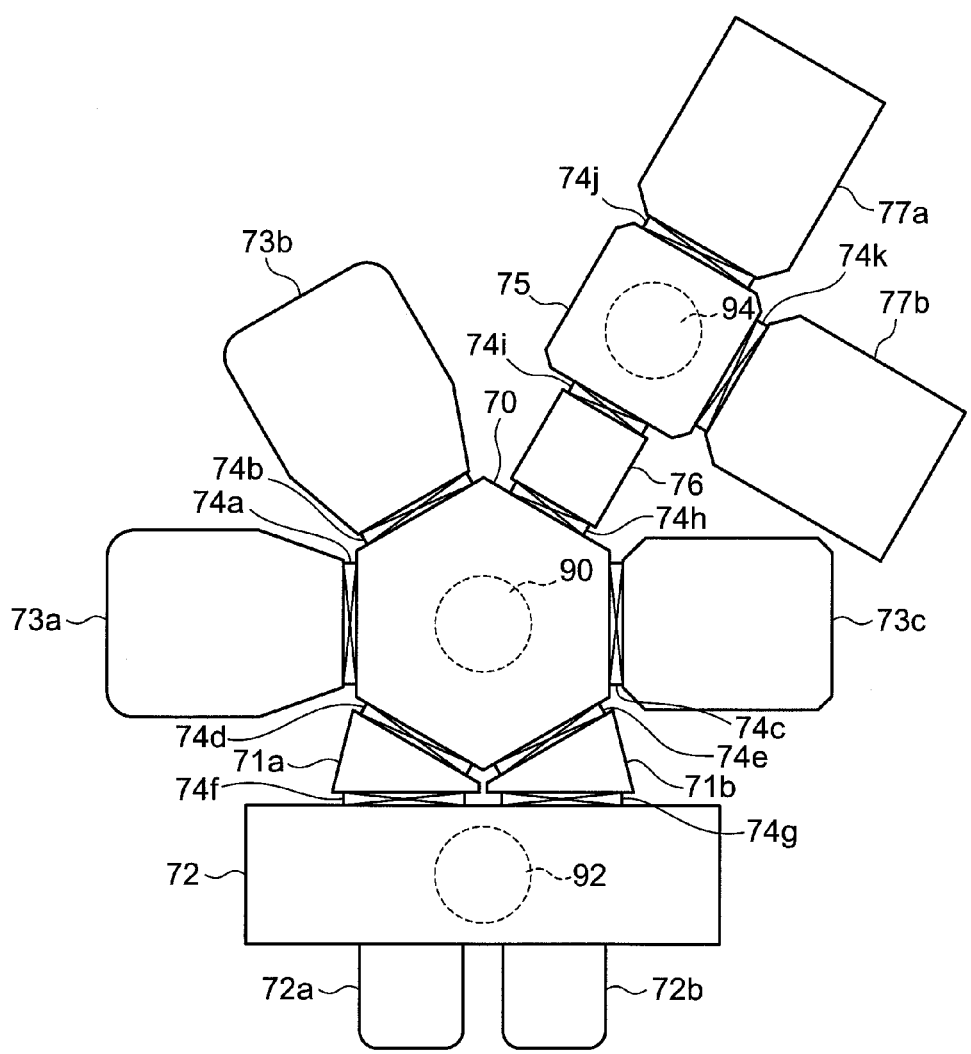
FIG. 13 is a schematic plan view to explain a comparative substrate processing apparatus.

Referring to FIG. 13, a substrate processing apparatus of a Comparative Example 1 is provided, in place of the chamber assembly 100 of the preferable exemplary embodiments of the present invention, with a pass chamber 76 attached to the transfer core chamber 70 through a gate valve 74h, an auxiliary transfer core chamber 75 that is attached to the pass chamber 76 through a gate valve 74i, and process chambers 77a, 77b that are respectively attached to the auxiliary transfer core chamber 75 through gate valves 74j, 74k. A substrate transfer robot 94 is also provided to the auxiliary transfer core chamber 75. No particular substrate processing is performed in the pass chamber 76, however there are plural pins (not illustrated in the drawings) provided for supporting the substrate 22. Thus by temporarily supporting the substrate 22, the substrate 22 is indirectly passed across from the substrate transfer robot 90 to the substrate transfer robot 94. Note that in cases in which plural pins are not provided to the pass chamber 76, configuration may be made such that the substrate 22 is directly passed across from the substrate transfer robot 90 to the substrate transfer robot 94.

By adding the process chambers 77a, 77b to the transfer core chamber 70 that only has a limited number of ports, a complicated structure results, with the auxiliary pass chamber 76 and the auxiliary transfer core chamber 75 required, thereby further increasing the overall occupied floor space surface area. Moreover, when the number of ports of the transfer core chamber 70 is increased, there is also an increase by that amount in the occupied floor space surface area of the transfer core chamber 70. The process chambers 77a, 77b are arranged horizontally, so the occupied floor space surface area increases further. Moreover, making the transfer core chamber 70 larger, and providing a larger vacuum pump to match the increase in size also leads to an increase in cost.

In contrast thereto, the preferable exemplary embodiments of the present invention merely involves attaching the chamber assembly 100 to the transfer core chamber 70. The chamber assembly 100 is equipped with the transfer chamber 10, the process chamber 30 and the process chamber 50. The process chamber 30 is vertically stacked above the transfer chamber 10, and the transfer chamber 10 is vertically stacked above the process chamber 50. Namely, the chamber assembly 100 is equipped with the transfer chamber 10, and the process chamber 30 and the process chamber 50 that are stacked in the up-down direction thereon. Thus even though the process chamber 30 and the process chamber 50 are added to the transfer core chamber 70 that has a limited number of ports, the occupied floor space area only increases by the amount equivalent to 1 process chamber. The chamber assembly 100 of preferable exemplary embodiments of the present invention accordingly substitutes for the pass chamber 76, the auxiliary transfer core chamber 75 and the process chambers 77a, 77b of the Comparative Example 1, and thereby enables a large reduction to be achieved in the increase in occupied floor space area.

Comparative Example 2

Figure 14:
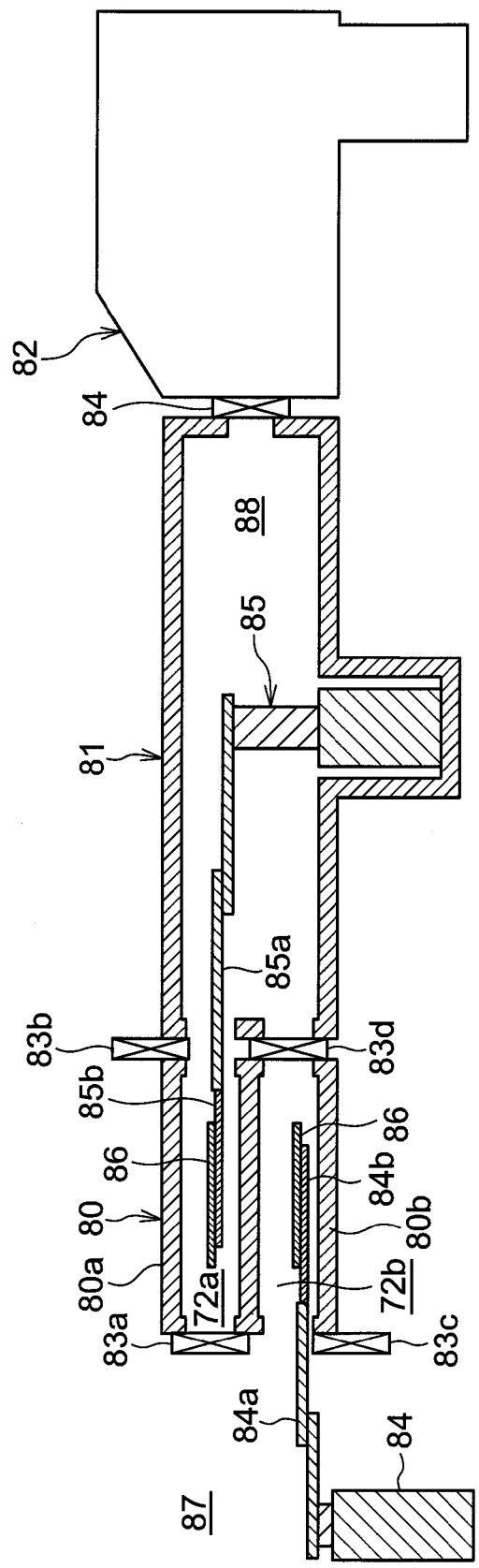
FIG. 14 is schematic vertical cross-section to explain another comparative substrate processing apparatus.

Referring to FIG. 14, a substrate processing apparatus is illustrated that uses a substrate transfer robot and has a smaller occupied floor space area. A load lock chamber 80 with an upper load lock chamber 80a and a lower load lock chamber 80b is attached respectively through slit valves 83b, 83d to a transfer core chamber 81 that has a substrate transfer robot 85. The transfer core chamber 81 is connected to a process chamber 82 through a gate valve 84. A load lock space 72a of the upper load lock chamber 80a and a load lock space 72b of the lower load lock chamber 80b are individually separated from the external environment 87 by transfer inlet gate valves 83a, 83b, and individually separated from a vacuum space 88 of the transfer core chamber 81 by slit valves 83b, 83d.

An external second robot 84 with an arm 84a and an end effector 84b loads or unloads a substrate 86 into or out of the load lock chamber 80b. The substrate 86 is transferred by the transfer robot 85 equipped with an arm 85a and an end effector 85b between the load lock chambers 80a, 80b and between the load lock chambers 80a, 80b and the process chamber 82. Substrate heating is performed in a space 72a of the load lock chamber 80a, and substrate cooling is performed in a space 72b of the load lock chamber 80b.

Accordingly, employing the load lock chamber 80 that has two vertically stacked load lock chambers 80a, 80b, and with the substrate transfer robot 85 only capable of moving in the vertical direction, enabling two types of processing to be performed with no significant any increase in footprint. Thus, as illustrated in FIG. 13, this alleviates the need to provide two separated process chambers with dedicated ports on the transfer core chamber in a planar row to two ports of a transfer core chamber.

However, normally a substrate transfer robot has a limited range of up-down movement (about 35 cm), and so the up-down movement range of the substrate inside the load lock space 72a of the upper load lock chamber 80a and inside the lower load lock chamber 80b is also limited, this places limitations on the processing in the upper load lock chamber 80a and the lower load lock chamber 80b, such as substrate heating, cooling and positional adjustment.

In contrast thereto, in the preferably exemplary embodiments of the present invention, the chamber assembly 100 is equipped with the transfer chamber 10, the process chamber 30 and the process chamber 50. The process chamber 30 is vertically stacked above the transfer chamber 10, and the transfer chamber 10 is vertically stacked above the process chamber 50. The vertical transfer elevator valve 14 and the vertical transfer elevator valve 17 are provided to the transfer chamber 10. The substrate mounting member 15 is provided at the upper side of the vertical transfer elevator valve 14. The substrate mounting member 18 is provided at the lower side of the vertical transfer elevator valve 17.

The opening 12a of the top wall 11a of the transfer chamber 10 is in communication with the opening 36a of the bottom wall 31a of the process chamber 30. The vertical transfer elevator valve 14 rises and joins to the top wall 11a and seals the opening 12a. When this occurs, the substrate 22 mounted on the substrate mounting member 15 is inside the process chamber 30, enabling processing of the substrate 22 to be performed inside the process chamber 30. When the vertical transfer elevator valve 14 is lowered the substrate mounting member 15 also lowers, and positioning at the specific substrate pass-over position in the transfer chamber 10 enables the substrate 22 to be taken out from the transfer core chamber 70, or the substrate 22 to be transferred into the transfer core chamber 70.

The opening 12b of the bottom wall 11b of the transfer chamber 10 is also in communication with the opening 57a of the top wall 51b of the process chamber 50. The vertical transfer elevator valve 17 is lowered and joins to the bottom wall 11b, sealing off the opening 12b. When this occurs the substrate 22 mounted to the substrate mounting member 18 is inside the process chamber 50, enabling processing to be performed to the substrate 22 inside the process chamber 50. When the vertical transfer elevator valve 17 rises the substrate mounting member 18 also rises, enabling positioning at the specific substrate pass-over position in the transfer chamber 10, and enabling the substrate 22 to be received from the transfer core chamber 70 or the substrate 22 to be transferred into the transfer core chamber 70.

Thus in the preferably exemplary embodiments of the present invention, without employing a substrate transfer robot that is limited in possible up-down movement range, the vertical transfer elevator valve 14, the substrate mounting member 15 that can move up and down either with the vertical transfer elevator valve 14 or independently thereof, the vertical transfer elevator valve 17, and the substrate mounting member 18 that can move up or down either with the vertical transfer elevator valve 17 or independently thereof. The up-down movement range can accordingly be made greater than when using a substrate transfer robot. As a result the up-down movement range does not limit the substrate processing performable within the process chamber 30 and the process chamber 50 above and below the transfer chamber 10, to such as substrate heating, cooling and positional alignment, thereby enabling a wider range of processing to be made.

Moreover, taking the substrate 22 out from the transfer core chamber 70 is performed between the transfer chamber 10 and the transfer core chamber 70, so large modifications to the transfer core chamber 70 are not required even though the vertical range of the process chambers 30, 50 are increased, and so this does not lead to an increase in cost.

Various typical exemplary embodiments of the present invention are explained above, however the present invention is not limited to these embodiments. Therefore, the present invention is intended to be limited only by the appended claims.

What is claimed is:

1. A substrate processing apparatus comprising:
   a first chamber and a second chamber that are provided in direct contact and stacked one above the other;
   a first opening that is provided in a first wall of the first chamber that faces the second chamber, and that allows a substrate to pass through the first opening;
   a second opening that is provided in a wall of the second chamber that faces the first chamber, that is in communication with the first opening, and that allows the substrate to pass through the second opening;
   a first opening and closing member that is provided inside the first chamber so as to move up and down and that opens and closes the first opening;
   a first substrate mounting member that is provided closer to the second chamber than the opening and closing member, that mounts the substrate and that moves the substrate between within the first chamber and within the second chamber;
   a first substrate processing member that is provided in the second chamber and that processes the substrate;
   a third opening that is provided in a second wall of the first chamber that faces the first wall of the first chamber, and that allows the substrate to pass through the third opening;
   a third chamber that is provided stacked above or below the first chamber on the opposite side of the first chamber to the second chamber;
   a fourth opening that is provided in a wall of the third chamber that faces the first chamber, that is in communication with the third opening, and that allows the substrate to pass through the fourth opening;
   a second opening and closing member that is provided inside the first chamber so as to move up and down and that opens and closes the third opening;
   a second substrate mounting member that is provided closer to the third chamber than the second opening and closing member, that mounts the substrate and that moves the substrate between within the first chamber and within the third chamber;
   a second substrate processing member that is provided in the third chamber and that processes the substrate;
   a fifth opening that is provided in a third wall of the first chamber that intersects with the first and second walls of the first chamber, and that allows the substrate to pass through the fifth opening;
   a fourth chamber having approximately the same height or less as the first chamber that is attached to the third wall of the first chamber, and that includes a wall provided with a sixth opening in communication with the fifth opening;
   a substrate transport member that is provided inside the fourth chamber, that transports the substrate between the fourth chamber and the first chamber or the first or second substrate mounting member positioned within the first chamber;

a gate valve disposed between said fifth and sixth openings;
a first drive source that is provided outside of the first chamber and that moves the first opening and closing member up or down;
a second drive source that is provided outside of the first chamber and that moves the second opening and closing member up or down; and
a third drive source that is provided outside the first chamber and outside the third chamber and that moves the second substrate mounting member up or down.

2. A substrate processing apparatus comprising:
a first chamber and a second chamber that are provided in direct contact and stacked one above the other;
a first opening that is provided in a first wall of the first chamber that faces the second chamber, and that allows a substrate to pass through the first opening;
a second opening that is provided in a wall of the second chamber that faces the first chamber, that is in communication with the first opening, and that allows the substrate to pass through the second opening;
a first opening and closing member that is provided inside the first chamber so as to move up and down and that opens and closes the first opening;
a first substrate mounting member that is provided closer to the second chamber than the opening and closing member, that mounts the substrate and that moves the substrate between within the first chamber and within the second chamber;
a first substrate processing member that is provided in the second chamber and that processes the substrate;
a third opening that is provided in a second wall of the first chamber that faces the first wall of the first chamber, and that allows the substrate to pass through the third opening;
a third chamber that is provided stacked above or below the first chamber on the opposite side of the first chamber to the second chamber;
a fourth opening that is provided in a wall of the third chamber that faces the first chamber, that is in communication with the third opening, and that allows the substrate to pass through the fourth opening;
a second opening and closing member that is provided inside the first chamber so as to move up and down and that opens and closes the third opening;
a second substrate mounting member that is provided closer to the third chamber than the second opening and closing member, that mounts the substrate and that moves the substrate between within the first chamber and within the third chamber;
a second substrate processing member that is provided in the third chamber and that processes the substrate;
a fifth opening that is provided in a third wall of the first chamber that intersects with the first and second walls of the first chamber, and that allows the substrate to pass through the fifth opening;
a fourth chamber having approximately the same height or less as the first chamber that is attached to the third wall of the first chamber, and that includes a wall provided with a sixth opening in communication with the fifth opening;
a substrate transport member that is provided inside the fourth chamber, that transports the substrate between the fourth chamber and the first chamber or the first or second substrate mounting member positioned within the first chamber;
a gate valve disposed between said fifth and sixth openings;
a substrate rotation member that is provided on the second wall of the first chamber; and
a substrate orientation detection member that detects the orientation of the substrate; wherein
the second chamber is provided above the first chamber.

3. A substrate processing apparatus comprising:
a first chamber, a second chamber stacked over said first chamber, and a third chamber stacked below said first chamber;
a first opening that is provided in a first wall of the first chamber that faces the second chamber, and that allows a substrate to pass through the first opening;
a second opening that is provided in a wall of the second chamber that faces the first chamber, that is in communication with the first opening, and that allows the substrate to pass through the second opening;
a first opening and closing member that is provided inside the first chamber so as to move up and down and that opens and closes the first opening;
a first substrate mounting member that is provided above said first opening and closing member, that mounts the substrate and that moves the substrate between within the first chamber and within the second chamber;
a first substrate processing member that is provided in the second chamber and that processes the substrate;
a third opening that is provided in a second wall of the first chamber that faces the first wall of the first chamber, and that allows the substrate to pass through the third opening;
a fourth opening that is provided in a wall of the third chamber that faces the first chamber, that is in communication with the third opening, and that allows the substrate to pass through the fourth opening;
a second opening and closing member that is provided inside the first chamber so as to move up and down and that opens and closes the third opening;
a second substrate mounting member that is provided below said second opening and closing member, that mounts the substrate and that moves the substrate between within the first chamber and within the third chamber;
a second substrate processing member that is provided in the third chamber and that processes the substrate;
wherein said second substrate mounting member moves independently of said second opening and closing member.

4. The substrate processing apparatus of claim 3, further comprising:
a first drive source that is provided outside of the first chamber and that moves the first opening and closing member up or down
a second drive source that is provided outside of the first chamber and that moves the second opening and closing member up or down; and
a third drive source that is provided outside the first chamber and outside the third chamber and that moves the second substrate mounting member up or down.

5. A substrate processing apparatus comprising:
a first chamber and a second chamber that are provided in direct contact, the second chamber being stacked above the first chamber;
a first opening that is provided in a first wall of the first chamber that faces the second chamber, and that allows a substrate to pass through the first opening;
a second opening that is provided in a wall of the second chamber that faces the first chamber, and that allows the substrate to pass through the second opening;

an opening and closing member that is provided inside the first chamber so as to move up and down and that opens and closes the first opening;

a first substrate mounting member that is provided closer to the second chamber than the opening and closing member, that mounts the substrate and that moves the substrate between within the first chamber and within the second chamber;

a substrate processing member that is provided in the second chamber and that processes the substrate;

a second wall of the first chamber that is opposite the first wall of the first chamber, and a third wall of the first chamber that intersects the first and second walls of the first chamber;

a third opening that is provided in the third wall of the first chamber;

a third chamber having approximately the same height or less as the first chamber that comprises a wall with a fourth opening that is in communication with the third opening via a gate valve;

a substrate transport member that is provided inside the third chamber, that transports the substrate between the third chamber and the first chamber;

a second substrate mounting member that is provided inside the first chamber at the opposite side of the opening and closing member to the first substrate mounting member;

a substrate rotation member that is provided on the second wall of the first chamber; and a substrate orientation detection member that detects the orientation of the substrate.

6. The substrate processing apparatus of claim 5, further comprising:

a fifth opening in the second wall of the first chamber;

a fourth chamber positioned below the first chamber, the fourth chamber comprising a sixth opening that is provided in a wall of the fourth chamber that faces the first chamber, the sixth opening being in communication with the fifth opening thereby allowing the substrate to pass between the first and fourth chambers.

* * * * *